(12) United States Patent
Goldstein

(10) Patent No.: US 6,846,086 B2
(45) Date of Patent: Jan. 25, 2005

(54) MIRROR ASSEMBLY WITH THERMAL CONTOUR CONTROL

(75) Inventor: Michael Goldstein, Ridgefield, CT (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/095,621

(22) Filed: Mar. 11, 2002

(65) Prior Publication Data

US 2003/0169520 A1 Sep. 11, 2003

(51) Int. Cl.⁷ .............................................. G02B 7/182
(52) U.S. Cl. ........................ 359/846; 359/845; 359/820
(58) Field of Search ................................ 359/845, 846, 359/848, 849, 820; 374/208

(56) References Cited

U.S. PATENT DOCUMENTS

| | | | | |
|---|---|---|---|---|
| 3,753,322 A | * | 8/1973 | Bordes | 451/42 |
| 5,460,450 A | * | 10/1995 | Buck | 374/20 |
| 6,526,086 B1 | * | 2/2003 | Wakabayashi et al. | 372/69 |

OTHER PUBLICATIONS

Parks, Robert E., Chapter 40 Optical Fabrication, 1995, McGraw–Hill, Inc., Handbook of Optics vol. I, pp. 40.3–40.5.*

* cited by examiner

Primary Examiner—Audrey Chang
Assistant Examiner—Denise S. Allen
(74) Attorney, Agent, or Firm—Fish & Richardson P.C.

(57) ABSTRACT

A system for compensating for heating effects in a mirror. Different areas of the mirror are associated with buried temperature sensors. Each temperature sensor is monitored, and used to create a map of current temperatures. The map of current temperatures may be corrected according to baseline values, and then is used to compensate for temperature differences.

16 Claims, 2 Drawing Sheets

MIRROR ASSEMBLY WITH THERMAL CONTOUR CONTROL

BACKGROUND

Mirrors may be used to focus high energy beams of light for various applications including the imaging process used in lithography. The power absorbed by such mirrors is expected to increase in the extreme ultraviolet (EUV) region as compared to longer wavelengths. While these mirrors can have a reflectivity that approaches 70%, the roughly 30% inefficiency leads to residual heating effects. This heating may be detrimental.

The heating of such mirrors tends to be non-uniform and may expand surfaces of the materials. These expansions may deform the material and may generate wavefront errors.

Reflectivity in the EUV spectral region is obtained through the use of multilayer interference coatings, typically alternating layers of Molybdenum and Silicon. Heating these multilayer coatings may tend to shift the center wavelength as a result of induced changes in physical thickness and index of refraction. The operation of these EUV mirrors may include narrow bandwidth reflectivity. This shift of center wavelength may reduce radiometric efficiency at the design wavelength.

All of these undesirable changes to the mirror that are based on heating may be generically referred to as aberrations. These aberrations may reduce image quality.

These heating effects can vary dependent on time, making them difficult to compensate. Feedback control of the light source, i.e., control of absolute output, may be able to compensate for the transmission changes in an optical system resulting from the temperature change of the mirrors. However, this does not overcome the loss of efficiency and may not adequately compensate for any local non-uniform heating effects that will change the projected image. The use of materials with ultra-low coefficients of thermal expansion may also improve the operation. However, the use of these materials may be limited, since they may be incompatible with the optical properties required from the multilayer coatings.

BRIEF DESCRIPTION OF THE DRAWINGS

These and other aspects will now be described in detail with reference to the accompanying drawings, wherein.

DETAILED DESCRIPTION

The present application describes compensation for temperature gradients that may exist over the surface of the mirror. Uncompensated heating may change the average temperature of a mirror. The temperature gradients may affect the multilayer coatings of such a mirror. For example, these temperature gradients may reduce the reflectivity of the mirror and may create spectral apodization. In this context, spectral apodization is the change of the source spectrum through attenuation and may impact such metrics as bandwidth and center wavelength.

In an imaging system used for semiconductor processes and other similar systems, the illumination pattern may be continually changing. For example, the exposure forming the mask pattern may change for different exposures. Because of this dynamic nature of the illumination system, any static solution to the heating issue may not adequately compensate for heating issues.

Figure 1:
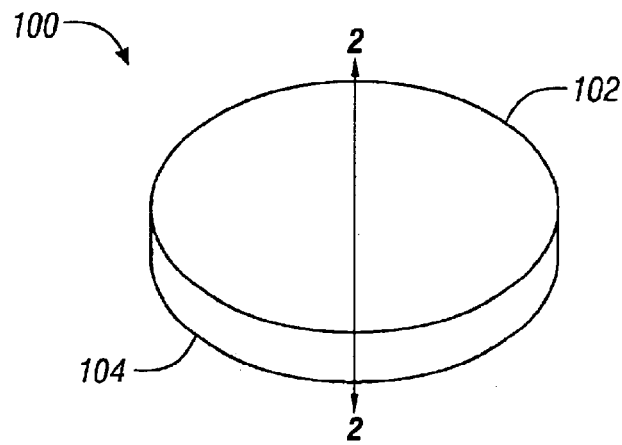
FIG. 1 shows a mirror in a EUV setup.
Figure 2:
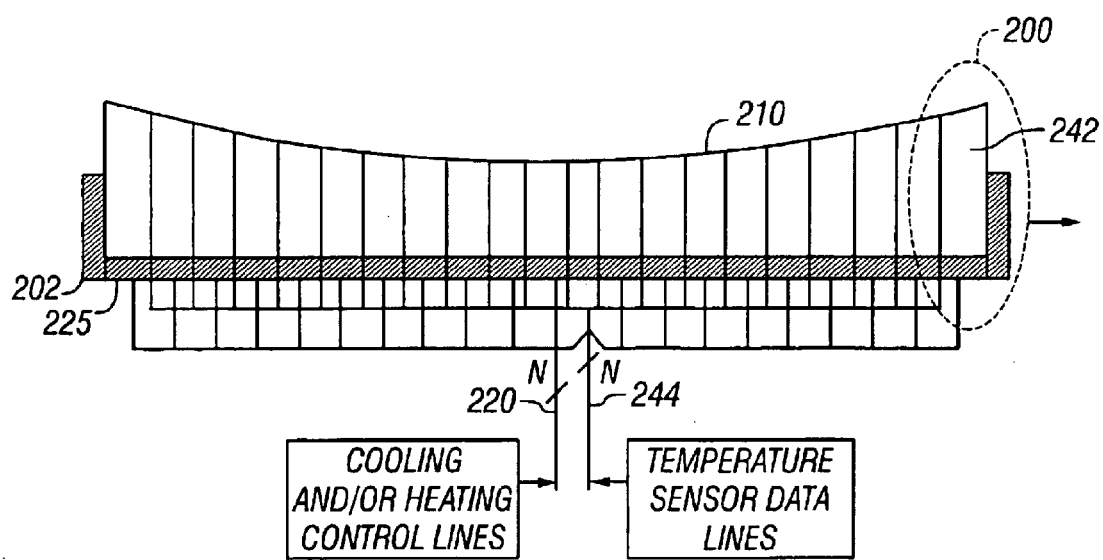
FIG. 2 shows a cross section of the mirror device including a cooling element, and temperature sensing elements.
Figure 3:
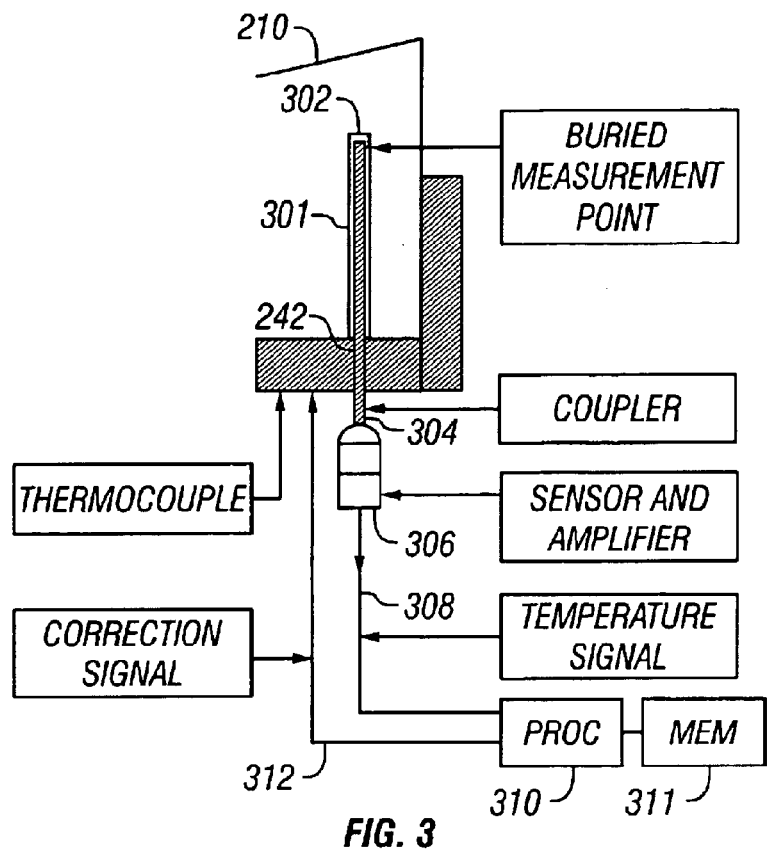
FIG. 3 shows a close-up of a cooling element and a temperature sensing element.

An embodiment which addresses these issues is diagrammed in FIGS. 1–3. FIG. 1 shows a basic mirror 100 used for EUV illumination. This mirror may be a 20 cm diameter mirror formed of a composite mirror material such as Zerodur. Zerodur is a known material for mirrors of this type with a thermal conductivity of 0.00146 watts/(mm× degrees Kelvin). The mirror has a front, reflective surface 102, and a rear surface 104.

This mirror may be a 20 cm diameter, concave EUV mirror, for example.

The mirror is conceptually divided into a plurality of areas. Each area has a measurement element and a heating cooling element. The temperature measurement elements are buried, that is they are formed to measure a temperature at a location just under the operative optical surface 102 of the mirror. Each temperature measurement element measures the temperature at an area that is as close as possible to the reflective surface 102.

Each of the temperature adjusting elements may correspond to one of the measuring areas and may be formed on an exterior surface of the mirror, e.g. the rear surface of the mirror. There may be, for example, a hundred of these element pairs (temperature detecting and temperature adjusting elements) spread over the mirror's area, e.g., evenly spaced over the areas. Alternatively, there may be different numbers of temperature detecting/adjusting elements.

A control system uses the information from the measurement points to automatically control the corresponding electronic heating/cooling elements and to maintain a controlled temperature differential over the surface of the mirror.

FIG. 2 shows a cross-section along the line 2—2 in FIG. 1. A plurality of temperature adjusting elements, here cooling/heating elements 225, are arrayed on the rear surface 104 of the mirror. For example, these materials may be thermoelectric devices, or other devices which may cause heating and/or cooling effects based on an applied control signal. These control signals are respectively applied over a plurality of cooling/heating control lines 220, respectively connected to each of the cooling/heating elements 225.

Measurement points are formed buried in the mirror, at a location near the reflective surface of the mirror. FIG. 3 shows a detailed diagram of a portion of the mirror in area 200. This shows how a bore 301 may be formed in the mirror body, with a measurement point buried within the bore. The measurement point may obtain the temperature at the point 302, at a location which is as close to the mirror surface 102 as possible, e.g. 1 mm from the mirror surface 102. Each measurement point has a separate line such as 242 which carries information obtained by the sensor. All of the lines from all of the sensors collectively form an array of lines 244.

Since the end result is to measure the uneven heat on the optical surface 210 of the mirror, the measurement points are preferably located as close to the surface of the mirror as possible. For example, the buried temperature points such as 302 may be between 100 microns and 2 mm away from the optical surface 210. An exemplary value may be 1 mm. By getting as close to the surface of the mirror as possible, the feedback represents a value that is as close as possible to a feedback of the actual temperature of the mirror surface, rather than the temperature of an area close to the mirror surface.

In operation, the mirror may be formed by drilling holes in the rear surface of the mirror prior to polishing the mirror blank. In this way, the final polished mirror blank will not be distorted by the drilling of the holes. After the hole is finally formed as the bore in the mirror blank, the sensor is located at the top of the hole, and glued into place.

The temperature sensors 302 can include any sensor that changes characteristics as a function of temperature and produce a signal indicative of the changed temperature characteristics. For example, this may include a thermocouple, an optical thermometer, an optical fiber coupled sensor, or a pyrometer. Each measurement point is coupled through a coupler 304 to a sensor and amplifier assembly 306. The output temperature signal 308 may be connected to an off-mirror processor 310, which has an associated memory 311.

As explained herein, the processor creates a matrix of correction signals 312. Each correction signal 312 is associated with a specific area on the mirror. That correction signal is then applied to one or more respective temperature adjusting element 225, that is also associated with that specific area on the mirror.

The matrix of correction signals 220 are connected to temperature array lines 244. Each correction signal may command a temperature adjusting element 225 to heat or cool by an amount which is effective to compensate for some of the heating and/or cooling of the mirror. The temperature adjusting elements can be thermoelectric elements or ohmic heating elements. Alternatively, the control lines 220 may control heating or cooling by controlling a valve that selectively allows either hot or cold gas or fluid to flow to the exterior mirror surface 202.

Figure 4:
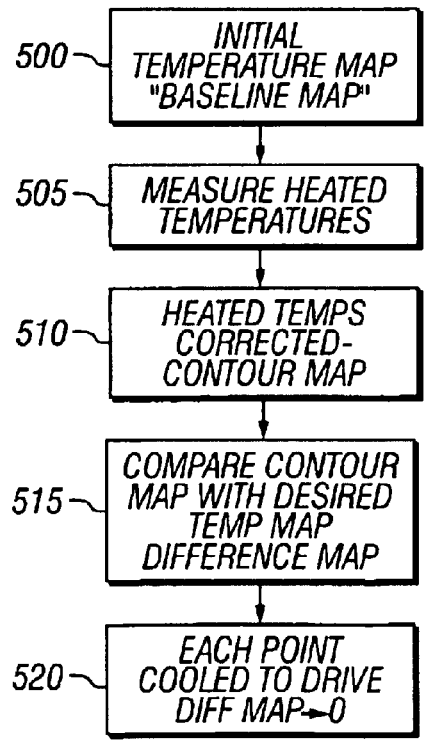
FIG. 4 shows a flowchart of operation.

In operation, the processor 310 may carry out the basic control system described with reference to FIG. 4.

At 500, a temperature map representing an initial temperature map is formed. This initial temperature map is measured from the buried sensors within the mirror. The initial temperature map measures the mirror in a cold state in order to determine baseline errors in the plurality of sensors. This map is called, as shown, the "baseline map".

505 represents the condition where the mirror is heated by the illumination. The temperature sensors 302 record these heated temperatures at each area. The matrix of temperatures, representing the temperatures at each area, are measured at 505.

At 510, the heated temperatures are corrected. The correction of heated temperatures is carried out by subtracting the baseline map, point by point, from the heated temperature map. This creates a corrected map called a "contour map".

A desired temperature map represents the desired temperature on the surface of the mirror. These may simply be amounts which show all points on the mirror being the same temperature. Alternatively, these may be maps which show different points on the mirror having different temperatures.

The desired temperature map may be compared against the contour map at 515. This is used to create a "difference map". The difference map represents the difference between each of a matrix of points on the mirror and the desired temperature of those points on the mirror.

At 520, control signals are generated for each of the plurality of points. Each point is cooled or heated as appropriate to drive the points in the difference map towards zero.

Sizes of the points/areas may be ascertained based on the effective footprint on the surface of the mirror. Each heating or cooling element has an effective footprint. If multiple sensors are associated with each temperature A weighted average of the sensors represented in that footprint on the difference map are used to either raise or lower the element's temperature, in order to zero the difference map. This is done via a control loop that tracks dynamic conditions. The best relationship will depend on the specific mirror design (thickness, surface shape, etc.), and may be ascertained by trial and error, or direct solution of the heat equation. The solution may be calculated either analytically or numerically.

Exemplary data explains the effect of the system according to the present invention. Assume a 20 cm mirror supporting 10 watts of combined in band and out of band power. A concave mirror of this type may experience a temperature range over the top surface of 37.5 degrees Kelvin with a temperature range for the entire element of 46.9 degrees Kelvin. A flat extreme ultraviolet mirror may actually have more variability over its surface. For example, this mirror may have a temperature range over the element of approximately 78.3 degrees K. with a 60.8 K. degree range over the top surface. Simulations have shown that the same mirror, when using the present system, may have only a 9.6 degree K. range over the top surface; although the temperature range over the entire element may be 114.1 degrees K.

More generally, however, in an embodiment, monitoring of local heating is carried out, and local control of the temperature is followed to maintain a minimized differential across the surface.

Although only a few embodiments have been disclosed in detail above, other modifications are possible.

What is claimed is:

1. A compensation system, comprising:
    a mirror having a reflecting surface and an exterior rear surface which faces away from the reflecting surface and is opposite said reflecting surface, said rear surface having a plurality of holes therein;
    an array of temperature detecting parts, each part in the array of temperature detecting parts formed in one of said holes, to be close to but not on, said reflecting surface at a measuring area of said mirror and detecting a temperature at said area close to said reflecting surface; and
    an array of temperature adjusting parts, each part in the array of temperature adjusting parts being at a heating/cooling area close to a respective measuring area of one of said temperature detecting parts but adjacent to said exterior rear surface, and each part in said array of temperature adjusting parts operative to adjust a temperature of said heating/cooling area.

2. A system as in claim 1, further comprising a processor, responsive to signals indicative of said temperatures, and controlling temperature compensation according to said signals from said array of temperature detecting parts.

3. A system as in claim 2, wherein said processor stores an initial temperature map indicative of unheated temperatures of said parts of said mirror, and uses said initial temperature map to compensate said signals.

4. A system as in claim 3, wherein said initial temperature map includes temperatures for each of the array of temperature detecting parts, and said processor is operative to subtract each current temperature values from each signal indicative of an initial temperature map.

5. A system as in claim 2, wherein said processor forms a value indicative of a difference between each signal indicative of temperatures and each element of said initial temperature map, and uses said difference to control an output signal.

6. A system as in claim 5, wherein said output signal is produced to drive said difference towards zero.

7. A system as in claim 6, wherein said temperature adjusting parts comprise thermoelectric elements.

8. A system as in claim 6, wherein said temperature adjusting parts comprise ohmic elements.

9. A system as in claim 6, wherein said temperature adjusting parts comprise controls for delivery of temperature-controlled fluids.

10. A system as in claim 1, wherein each of said temperature detecting parts is between 2 mm and 100 um from said reflective surface.

11. A system as in claim 1, wherein said temperature adjusting parts are each pressed against a rear surface of said mirror.

12. A method of forming a mirror, comprising:

forming a mirror blank having a first surface which will form an optically reflective surface, and a second surface opposite said first surface;

forming a plurality of holes in said second surface extending towards said first surface, and reaching a distance that is two millimeters or less from said first surface; and finally polishing said first surface of said mirror blank after said forming said plurality of holes; and using said plurality of holes to sense temperatures on said optically reflective surface.

13. A method as in claim 12, further comprising controlling temperature compensating elements near said plurality of holes to compensate for temperature variations near said plurality of holes.

14. A method as in claim 12, wherein said using comprises using a thermocouple.

15. A method as in claim 12, wherein said using comprises using a pyrometer.

16. A method as in claim 13, further comprising compensating for variations between optical temperature sensors, prior to compensate for said temperature variations.

* * * * *